United States Patent

Cubero Pitel

[11] Patent Number: 6,160,239
[45] Date of Patent: Dec. 12, 2000

[54] LASER SOLDERING PROCEDURE APPLICABLE TO THE JOINING OF PINS OVER PRINTED CIRCUIT BOARDS

[76] Inventor: José Antonio Cubero Pitel, Passeig de l'Estació, 14, Valls, Spain

[21] Appl. No.: 09/267,284

[22] Filed: Mar. 12, 1999

[30] Foreign Application Priority Data

Mar. 13, 1998 [ES] Spain ................................. 9800549

[51] Int. Cl.⁷ ................................................ B23K 26/00
[52] U.S. Cl. ............................. 219/121.64; 219/121.82; 228/179.1; 228/49.5
[58] Field of Search ................... 219/121.63, 121.64, 219/121.84, 121.82; 228/179.1, 49.5

[56] References Cited

U.S. PATENT DOCUMENTS

| | | | |
|---|---|---|---|
| 3,267,249 | 8/1966 | Veth | 219/121.63 |
| 3,485,996 | 12/1969 | Chiou et al. | 219/121.63 |
| 4,612,208 | 9/1986 | Reichenecker | 427/597 |
| 4,697,061 | 9/1987 | Spaeter et al. | 219/121.64 |
| 4,733,039 | 3/1988 | Schnable et al. | 219/121.85 |
| 4,774,394 | 9/1988 | Lemke | 219/121.6 |
| 5,029,243 | 7/1991 | Dammann et al. | 219/121.77 |
| 5,250,781 | 10/1993 | Kanda et al. | 219/121.63 |
| 5,763,854 | 6/1998 | Dittman et al. | 219/121.63 |
| 6,013,897 | 1/2000 | Sunda | 219/216 |

*Primary Examiner*—Samuel M. Heinrich
*Attorney, Agent, or Firm*—Ostrolenk, Faber, Gerb & Soffen, LLP

[57] ABSTRACT

The proposed procedure, that of laser soldering or welding, is an auto-energetic process in which the density of the laser beam is obtained because of the concentration of light beams. Said process involves two metals (alike or disimilar) and, previously to the metallurgical union, same must be positioned in front of the laser head with enough accuracy. The metallurgical union is carried out by direct fusion of the metals to be joined and not being therefore necessary to use any filler metal.

12 Claims, 2 Drawing Sheets

(a)

(b)

(c)

LASER SOLDERING PROCEDURE APPLICABLE TO THE JOINING OF PINS OVER PRINTED CIRCUIT BOARDS

The present application for a Patent of Invention consists, as indicated in its title, in a "LASER SOLDERING PROCEDURE APPLICABLE TO THE JOINING OF PINS OVER PRINTED CIRCUIT BOARDS", which novel characteristics of manufacturing, shaping and design fulfill the mission for which it has been specifically designed with a maximum of safety and efficiency.

More specifically, the invention refers to the joining of short pins over printed circuit boards of 400 microns by carrying out the corresponding metallurgical joining by direct fusion of the metals by means of the energy generated by a laser beam.

In the state of the art, in order to carry out the joining of two metal elements wave soldering is the one commonly employed. In this process there are commonly several types of defects, such as missing welded seams, components not soldered, bridges between adjacent seams, micro-crossing of lines, micro-balls, and/or adjacent inter-tracks to the printed circuit board. These defects can produce electrical failures, such as short-circuits and continuity lacking which endanger the correct working of the system.

In the other hand, the conventional wave soldering requires a manual checking (after the process itself) in order to mend the above defects.

The above defects and the associated consequences are solved applying laser technology for the micro-soldering of the components over the printed circuit board. That is so because the laser soldering consists in direct fusion of the elements, making therefore unnecessary any filler metal. On the other hand, the laser soldering process itself is such that it does not require any other work in the unions made.

The currently used alloys for wave soldering of components over printed circuit boards have several limitations when these are submitted to mechanical, electrical and/or thermal stresses.

This is due to the difference of thermal expansion between the components and to the different materials intervening in the soldered union: inter-connection elements (short pin, tongue, female clip and other), the printed circuit board (copper and substrate) and the soldering alloy.

Therefore, when the soldered union is subjected to load and temperature cycles, as a consequence of the difference between the thermal expansion coefficients, the welding is submited to a stress or fatigue (thermo-mechanical fatigue).

Said fatigue, as a function of the stringency of the stress conditions, may create the electrical failure of the union.

The consequences that may derive from the thermo-mechanical fatigue are minimized when the joining is made using the laser technology.

That is so because the union between the inter-connection element (usually copper and alloys) and the copper of the printed circuit board is produced by means of a copper gasket produced because of the direct fusion of the materials to be interconnected.

That implies having a very homogeneous union and, as a consequence, a likeness of the thermal expansion coefficients that minimizes the effects of the thermo-mechanical fatigue.

From the environmental viewpoint, the advantages of laser technology for the performance of micro-soldering is justified because of the following:

The laser soldering does not need the use of flux or other fusion agent for the chemical cleaning of the surfaces to be soldered (as it is the case with soldering with conventional means).

The laser soldering process does not require the use of filler metal, eliminating the use of alloys containing lead (as is the case with the conventional wave soldering process).

The proposed procedure, that of laser soldering or welding, is an auto-energetic process in which the density of the laser beam is obtained because of the concentration of light beams. Said process involves two metals (alike or disimilar) and, previously to the metallurgical union, same must be positioned in front of the laser head with enough accuracy. The metallurgical union is carried out by direct fusion of the metals and it is not necessary to use any filler metal.

In the surface of the parts to join, the great concentration of luminic energy is converted into thermal energy. The fusion of the surfaces progress throughout the union area of thermal conduction.

In order to produce the welding, the energy of the beam must be kept below the vaporization temperature of the materials to be join. The mutual penetration depends basically from the induced heat and the thickness of the materials.

The technology used allows carrying out of welding with zones minimally affected by the heat, as well as an excellent metallurgical quality. The concentrated energy produces fusion and coalescency before appearing zones substantially affected by the heat are out play.

All metals reflect some of the light. The metals such as gold, silver, copper and platinum present difficulties to the laser soldering due to their high reflection index. Because of that, these require an intensive energy, provided by pulses with a very high peak power, or the coating with some absorbing material (graphite, nickel and other).

The flexibility of the laser handling makes it ideal for being used in automated and robotized processes. On the other hand, the use of an optic fiber helps to make a more versatile and flexible a laser system.

Lastly, the laser soldering process requires a clean working environment (in order to protect the optics), as well as considerations of health and hygiene.

Other details and characteristics of the present application for a Patent of Invention will be manifest through the reading of the description given herebelow, in which reference is made to the figures attached to this description where the above details are depicted in a rather schematic way. These details are given as an example, referring to a case of a possible practical embodiment, but is not limited to the details outlined; therefore this description must be considered from an illustrative point of view and with no limitations whatsoever.

Now I report the several elements numbered in the drawings attached to the present description: (10) power source, (11) laser cavity, (12) emited laser beam, (13) mirror, (14) unfocalized laser beam, (15) focalization optics, (16) working part, (17) movement system, (18) lens, (19) focalized laser beam, (20) welding, (21) short pin, (22) copper crown, (23) hole, (24) substrate, (25) union, (26) printed circuit board.

Figure 1:
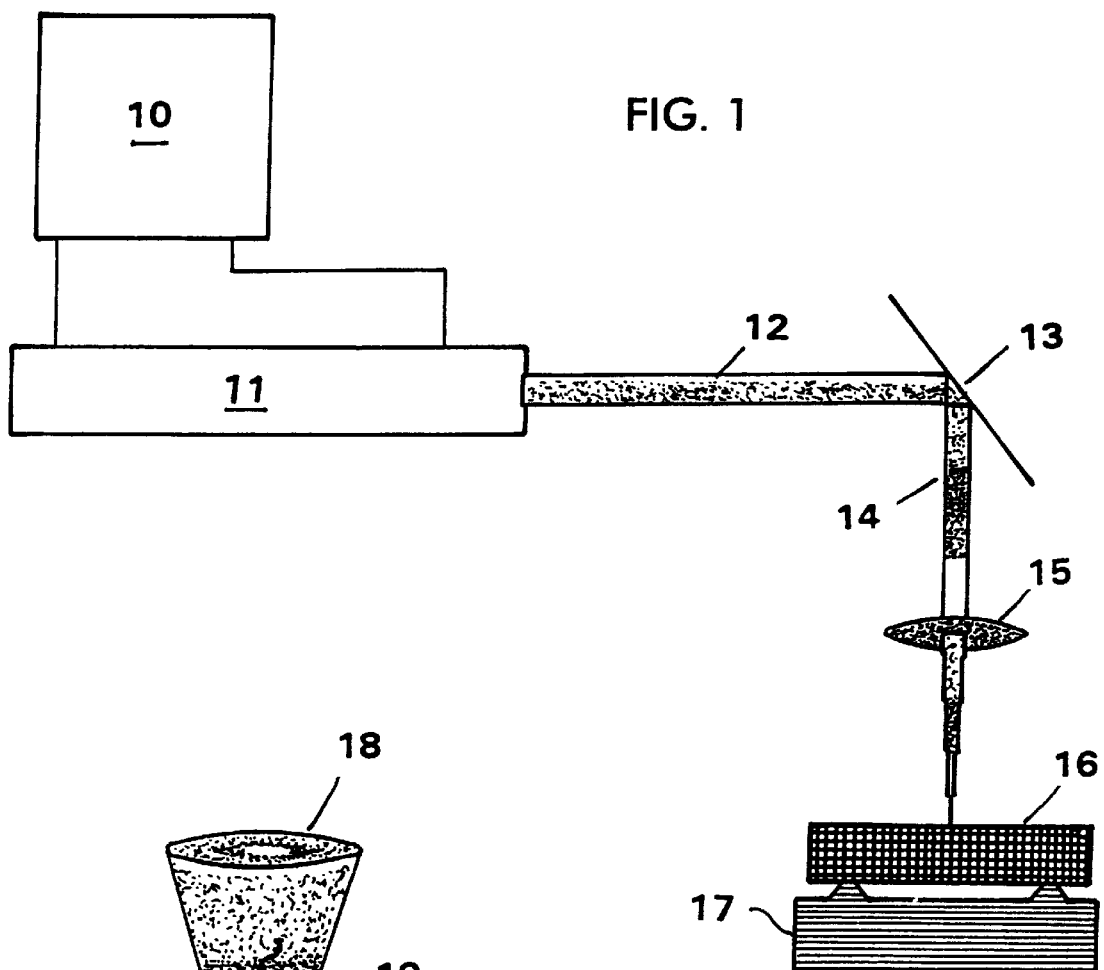
FIG. 1 shows a schematic drawing of the proposed soldering process.

The procedure proposed in the present invention uses a welding system as the one described in FIG. 1 in which we can see a power source (10) transmitting power to a laser cavity (11), which generates in combination with (10) an emited laser beam (12) which falls upon a mirror (13) which reflects an unfocalized laser beam (14) which penetrates into a focalization optics (15) and comes out of the same directed to a working part (16) which rests in a movement system (17) provided with multiple axis which allows its movement in the X, Y and Z coordinates in order that the working part (16) can move in the desired directions allowing a collaboration with the soldering system.

Figure 2:
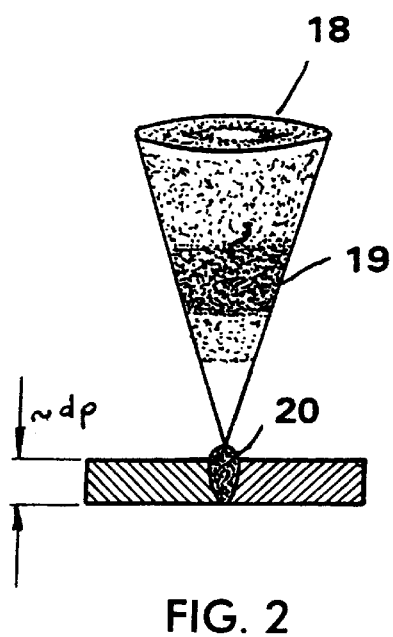
FIG. 2 is a simple schematic drawing of the laser arrangement applied to the soldering zone.

In the FIG. 2 is enlarged part of FIG. 1 and there can be seen how the focalization optics (15) represented by a specific lens (18) produces a focalized laser beam (19) in such a way that falls over a welding (20), said focalized beam having a penetration power specified in a penetration distance $d_p$.

Figure 3:
FIG. 3 is a schematic drawing of several types of laser soldering.
Figure 3:
Figure 3:
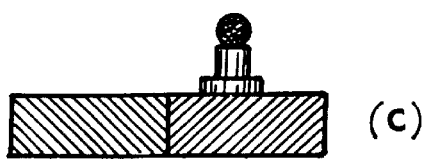

The soldering types which may be carried out by the proposed process depend, as can be seen in FIG. 3, of the different thicknesses of the material to be welded, see FIG. 3a, of the different metals to weld, see FIG. 3b, and also of the neighbourhood of the welded terminals, see FIG. 3c.

Figure 4:
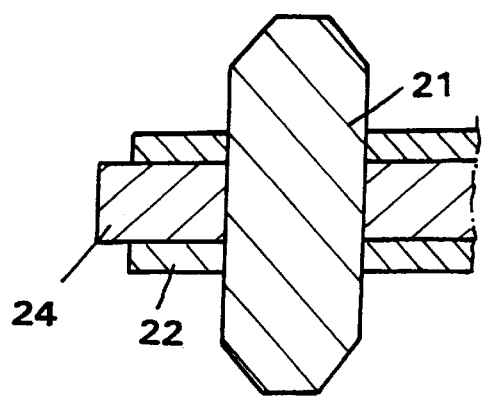
FIG. 4 shows a short pin (21) inserted in a printed circuit board (26).

The proposed procedure finds its practical fullfillment in the welding by laser, for instance, of a working part (16), in this case short pins (21) on printed circuit boards (26), such as it is shown in FIG. 4, in which there can be seen how a short pin (21) pass through a printed circuit board (26), formed of a substrate (24) coated at both faces with copper conductive tracks and in the neighbourhood of (21) of a copper crowns (22).

Previously to the laser soldering operation and as is a conventional solution, there are provided a series of holes in the printed circuit board (26) for the later mechanical insertion of said pins (21), in such a way that are kept arranged as can be seen in FIG. 4, following which the proposed laser soldering fuses the material of the pin (21) and that of the copper crown (22) producing the unions (25).

Figure 5:
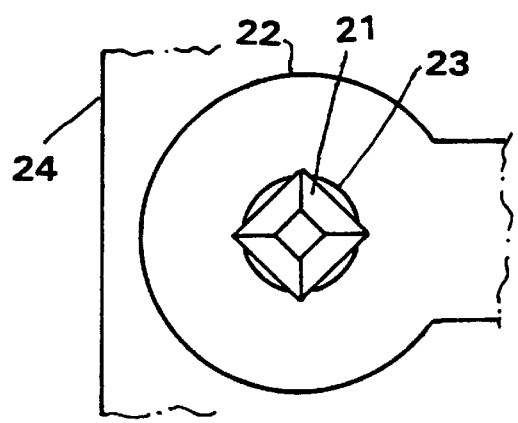
FIG. 5 shows different possibilities for performing the union of a short pin (21) and a printed circuit board (26).
Figure 5:
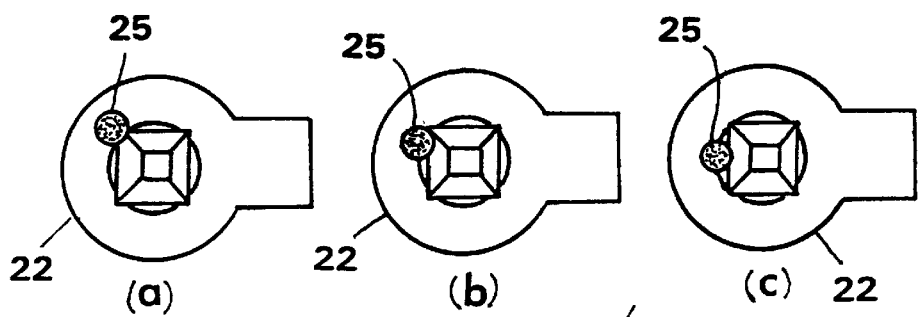

Said unions (25), as is shown in FIG. 5, can be produced in different situations, either in one of the apexes in what could be named a corner union, or in one of the pin (21) bases, which can be called lateral union, or in the center of one of said bases in what we may call a central union.

Figure 6:
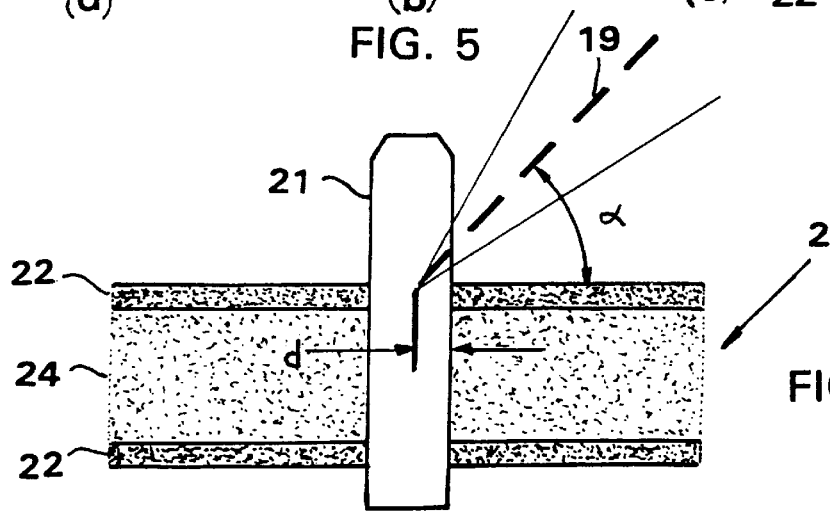
FIG. 6 shows the direction and firing or trigger point of the laser beam (19) over a short pin (21).

The direction and the trigger point of the focalized laser beam (19) is that shown in FIG. 6, being depicted there a printed circuit board (26) formed by a substrate (24) and a copper crown or ring (22), traversed by a short pin (21) and arranged for the proposed soldering, in which said focalized laser beam (19) is applied with an incidence angle σ, which varies between 30° and 45°. The distance d indicated in said Figure allows for the control of the amount of melt-down material of the short pin (21). It is proper that the melt-down area of the short pin may be superior to that of the copper crown or ring (22) of the printed circuit board (26) in order to avoid the union (25) being spoiled because of temperature changes. The range of variation of said distance d is established experimentally between 0 and 0.5 mm.

Normally, in the proposed laser soldering procedure is employed a protective gas in the environment of the part to be soldered, such as the short pin (21), in order to avoid oxidation during the soldering process itself.

The parameters of the laser beam applied, allowing the union (25), are in the impulse energy comprised between the 16 and the 40 joules and, a peak power between 3,500 to 4,000 wats.

The number of welding points (25) per pin (21) may vary between two and four at each face of the pin (21). Logically, the optimum electrical behaviour has been found for four welding points at each face of the printed circuit board (26).

Enough is disclosed in the present application for a Patent of Invention in agreement with the attached that it is understood any detail modifications regarded as convenient can be introduced, always without departing from the essence of the present patent.

What is claimed is:

1. A laser soldering process for the joining of a pin and a printed circuit board using a high energy process in which light waves are concentrated to obtain a high density laser beam which is applied to a point of union of two metals positioned in the path of the laser beam characterized in that the process comprises transmitting power from a power source to a laser and generating a laser beam, changing the path of the laser beam by interposing a mirror at a point in the laser beam's path such that the deflected beam comes into contact with focusing optics, focusing the laser beam to a point situated over a XYZ movement system, providing on the movement system a circuit board comprising a substrate having a metal thereon in contact with a hole therein containing the pin, and controlling the movement system such that a desired point of union between the pin and the metal at the hole is sufficiently close to the laser beam point of focus to effect welding at said desired point of union, wherein the laser beam travels through an inert atmosphere.

2. The process of claim 1 wherein the pin is a short pin, the circuit board has copper tracks on two opposing faces of the substrate and a copper ring at the hole and wherein the movement system is controlled so as to effect welding at a point of contact of the copper ring and the pin.

3. The process of claim 2 wherein the laser beam point of focus is at the apex of the pin.

4. The process of claim 2 in which the laser beam point of focus is in the neighborhood of the apex of the pin.

5. The process of claim 2 in which the laser beam point of focus is distant from the apex of the pin.

6. The process of claim 1 in which the metals at the desired point of union have different thicknesses.

7. The process of claim 1 in which the metals at the desired point of union are different.

8. The process of claim 1 in which the pin is disposed near a circuit board terminal.

9. The process of claim 1 in which the surface of the pin has a nickel coating of between 5 and 10 microns thereon.

10. The process of claim 1 in which the path of the laser beam is angled relative to the point of contact of the pin and the metal at the hole at an angle of between 30° and 35° and the energy of the laser beam is sufficient to cause melting of material to be joined over a distance between 0 and 0.5 mm.

11. The process of claim 1 in which the laser is pulsed at a pulse energy between 16 and 46 joules and a peak power between 3,500 and 4,000 watts.

12. The process of claim 1 in which movement of the movement system is controlled until 2 to 4 desired points of union between the pin and the metal at the hole have been positioned sufficiently close to the laser beam point of focus to effect welding at said desired points of union.

* * * * *